(12) United States Patent
Ge

(10) Patent No.: US 11,264,421 B2
(45) Date of Patent: Mar. 1, 2022

(54) METHOD FOR MANUFACTURING BACKSIDE-ILLUMINATED CMOS IMAGE SENSOR STRUCTURE

(71) Applicant: SHANGHAI IC R&D CENTER CO., LTD., Shanghai (CN)

(72) Inventor: Xingchen Ge, Shanghai (CN)

(73) Assignee: SHANGHAI IC R&D CENTER CO., LTD., Shanghai (CN)

( * ) Notice: Subject to any disclaimer, the term of this patent is extended or adjusted under 35 U.S.C. 154(b) by 94 days.

(21) Appl. No.: 16/643,566

(22) PCT Filed: Aug. 29, 2018

(86) PCT No.: PCT/CN2018/102885
§ 371 (c)(1),
(2) Date: Mar. 1, 2020

(87) PCT Pub. No.: WO2019/072043
PCT Pub. Date: Apr. 18, 2019

(65) Prior Publication Data
US 2020/0251510 A1 Aug. 6, 2020

(30) Foreign Application Priority Data
Oct. 13, 2017 (CN) .......................... 201710952663.7

(51) Int. Cl.
H01L 27/146 (2006.01)
(52) U.S. Cl.
CPC ...... H01L 27/1464 (2013.01); H01L 27/1462 (2013.01); H01L 27/1463 (2013.01); H01L 27/14621 (2013.01); H01L 27/14645 (2013.01); H01L 27/14685 (2013.01); H01L 27/14689 (2013.01)

(58) Field of Classification Search
None
See application file for complete search history.

(56) References Cited

U.S. PATENT DOCUMENTS

| | | | | |
|---|---|---|---|---|
| 2015/0311247 A1* | 10/2015 | Chen | .................... | H01L 27/1463 257/432 |
| 2015/0348966 A1* | 12/2015 | Zhao | ................. | H01L 21/02326 257/401 |
| 2015/0372033 A1* | 12/2015 | Cheng | ............... | H01L 27/14687 257/432 |
| 2017/0053959 A1* | 2/2017 | Hsieh | ................. | H01L 27/14621 |
| 2017/0062496 A1* | 3/2017 | Lai | .................... | H01L 27/14645 |

FOREIGN PATENT DOCUMENTS

CN 106486506 3/2017

* cited by examiner

Primary Examiner — Ali Naraghi
(74) Attorney, Agent, or Firm — Tianchen LLC.; Yuan R. Li; Yi Fan Yin

(57) ABSTRACT

The present disclosure discloses a method for manufacturing a backside-illuminated CMOS image sensor structure, the method comprises: providing a silicon substrate which has been subjected to a frontside processing and a back thinning; forming grid-shaped deep trenches on the back of the silicon substrate; forming an insulating layer on the inner wall surface of the deep trenches to form a grid-shaped deep trenchs isolation structure; forming a diffusion barrier layer on the surface of the insulating layer; filling metal in the deep trenches to form a grid-shaped composite structure in which the Metal grid is combined with the deep trenchs isolation structure.

10 Claims, 3 Drawing Sheets

METHOD FOR MANUFACTURING BACKSIDE-ILLUMINATED CMOS IMAGE SENSOR STRUCTURE

CROSS-REFERENCE TO RELATED APPLICATION

This application claims priority of International Patent Application Serial No. PCT/CN2018/102885, filed Aug. 29, 2018, which is related to and claims priority of Chinese patent application Serial No. 201710952663.7, filed Oct. 13, 2017. The entirety of each of the above-mentioned patent applications is hereby incorporated herein by reference and made a part of this specification.

TECHNICAL FIELD

The present disclosure relates to the technical field of CMOS image sensor manufacturing processes, in particular to a method for manufacturing a backside-illuminated Complementary Metal Oxide Semiconductor (CMOS) image sensor structure.

BACKGROUND

An image sensor is a device for sensing an optical signal. The CMOS image sensors are widely used in electronic devices, such as digital cameras, cell phone cameras and the like. These devices apply pixel array structures (typically including photodiodes and transistors) on a silicon substrate to sense an optical signal impinging on the silicon substrate and convert the sensed signal to an electrical signal.

A backside-illuminated CMOS image sensor structure is a newer sensor structure. The backside-illuminated CMOS image sensor may receive incident light from the back, thereby obtaining a greater amount of light. Therefore, compared to conventional frontside-illuminated CMOS image sensors, the backside-illuminated CMOS image sensor has better performance, especially under low intensity lighting conditions.

In order to improve image quality, the image sensors need to reduce optical signal crosstalk and electrical signal crosstalk, which correspondingly requires the use of a Metal grid and a Deep Trenchs Isolation (DTI) processes. Currently, the method for manufacturing a backside-illuminated CMOS image sensor usually includes the etching and the filling of the DTI, the depositing of an anti-reflective coating (ARC), the depositing and patterning of the Metal grid, forming of color filters (CF) and forming of Micro-lenses, etc. Wherein for preventing electrical signal crosstalk, the DTI process is typically completed before the anti-reflective coating, which comprises etching the silicon substrate with the small size (<1 μm) and high depth-to-width ratio (>10), filling the insulating layer, filling diffusion barrier, and filling the DTI material, etc. For preventing optical signal crosstalk, the Metal grid process is typically done after the anti-reflective coating, which comprises depositing the metal on the anti-reflective coating, patterning and etching the metal, etc.

However, the above-described two processes, which are the DTI process and the Metal grid process used to prevent cross-talk, make the overall process more complex, time consuming and costly. In addition, the two processes also require high precision alignment between each other, resulting in further increased overall process difficulty, and reduced yield.

SUMMARY

The present disclosure aims to overcome the defects in the prior art and provide a method for manufacturing a backside-illuminated Complementary Metal Oxide Semiconductor (CMOS) image sensor structure.

To achieve the above purposes, the method for manufacturing the backside-illuminated CMOS image sensor structure, comprises the following steps:

Step 01: providing a silicon substrate which has been subjected to a frontside processing and a back thinning;

Step 02: forming grid-shaped deep trenchs on the back of the silicon substrate;

Step 03: forming an insulating layer on the inner wall surface of the deep trenchs to form a grid-shaped deep trenchs isolation structure;

Step 04: forming a diffusion barrier layer on the surface of the insulating layer;

Step 05: filling metal in the deep trenchs to form a grid-shaped composite structure in which the Metal grid is combined with the deep trenchs isolation structure.

Preferably, in step 01, the frontside processing comprises forming a photodiode array on the front side of the silicon substrate; in step 02, the grid-shaped deep trenchs formed is located between the photodiodes in the photodiode array.

Preferably, the bottom surface of the deep trenchs is up-down staggered with the top surface of the photodiode.

Preferably, the mothed further comprising:

Step S06: etching the back of the silicon substrate to form the cavities in the grid of the deep trenchs isolation structure;

Step 07: coatinging an anti-reflection layer on the back of the silicon substrate;

Step 08: performing the color filter material filling in the cavities to form a color filter.

Preferably, in step 02, the grid-shaped deep trenchs is formed on the back of the silicon substrate by a lithography and an etch processes, and the depth-to-width ratio after the etch process is at least 10:1.

Preferably, the mothed further comprising removing the photoresist on the silicon substrate and cleaning the silicon substrate after the step 02.

Preferably, in step 03, the insulating layer is deposited on the inner wall surface of the deep trenchs by CVD or ALD; in step 04, the diffusion barrier layer is formed on the surface of the insulating layer by CVD, PVD, ALD, or sputtering.

Preferably, in step 05, filling the metal W in the deep trenchs by CVD or PVD, then performing the surface planarization process by CMP, removing the excess metal W, the diffusion barrier layer material, and the insulating layer material on the surface.

Preferably, in step 06, the back of the silicon substrate is wet etched using the grid-shaped deep trenchs isolation structure as a mask.

Preferably, in step 07, the anti-reflection layer is blanket deposited on the back of the silicon substrate by CVD or ALD, and the back of the silicon substrate, the surface and the sidewall of the deep trenchs isolation structure are all covered by the anti-reflection layer; in step 08, a photoresist with a dye is filled in the cavities as the color filter material by spin coating.

The advantage of the present disclosure is that the formed deep trenchs isolation structure is used as a barrier layer when the back of the silicon substrate is etched, and the self-aligned etching is formed, so that the lithography step is reduced and the cost is saved. Compared with the method for forming the traditional deep trenchs isolation structure and the metal grid, a one-step method for forming the deep trenchs isolation structure and the metal grid is used according to the present disclosure. The one-step method can reduce the process steps, the grid-shaped composite structure in which the metal grid is combined with the deep trenchs isolation structure plays the role of the Metal grid and the deep trenchs isolation structure at the same time, so that the requirement of high precision alignment of the deep trenchs isolation structure and the metal grid in the traditional process is avoided, the utilization rate of the material is improved, the cost is saved, the process difficulty is reduced, and the production efficiency is improved. Further, the embedded structure of the color filter can also be realized at the same time according to the present disclosure, so that the photosensitive area is closer to the plane of the incident light, and the photosensitive effect of the device is better.

DETAILED DESCRIPTION

The present disclosure will be described in further detail below in conjunction with the appended drawings. It is to be understood that the disclosure is capable of various changes in various embodiments without departing from the scope of the invention, and the description and drawings are to be regarded as illustrative in nature, and not as restrictive of the invention. It is to be noted that the figures are in a very simplified form and that non-precise ratios are used, and are used merely for convenience and clarity to aid in the description of embodiments of the present disclosure.

Figure 1:
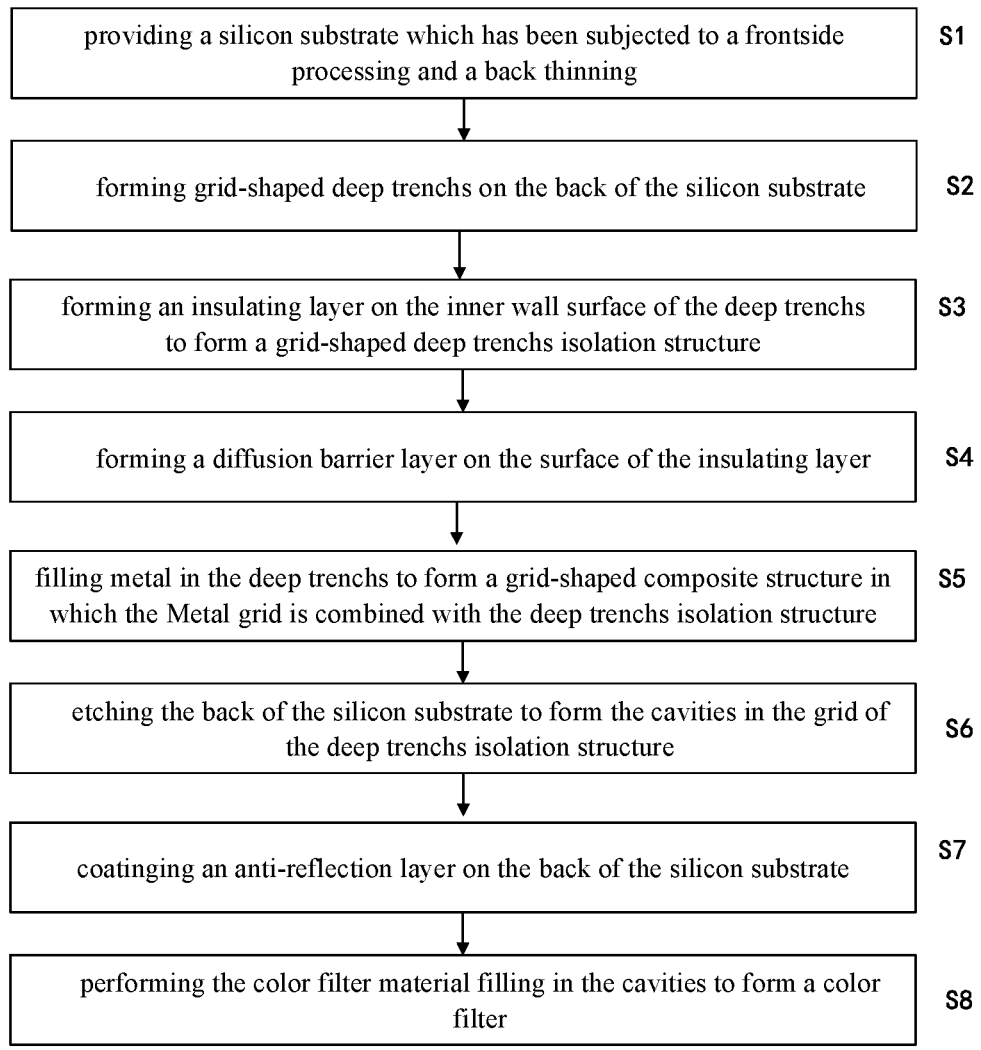
FIG. 1 is a flow chart of a method for manufacturing a backside-illuminated Complementary Metal Oxide Semiconductor (CMOS) image sensor structure according to a preferred embodiment of the present disclosure

Please refer to FIG. 1 and FIGS. 2-6, FIG. 1 is a flow chart of a method for manufacturing a backside-illuminated Complementary Metal Oxide Semiconductor (CMOS) image sensor structure according to a preferred embodiment of the present disclosure; and FIGS. 2-6, are schematic diagrams of steps of the method for manufacturing the backside-illuminated CMOS image sensor structure according to the method showing in FIG. 1. As shown in FIG. 1, the method for manufacturing the backside-illuminated CMOS image sensor structure comprises the following steps:

Step 01: providing a silicon substrate which has been subjected to a frontside processing and a back thinning.

Figure 2:
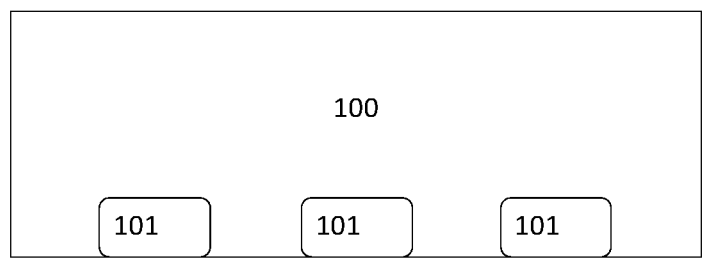
FIGS. 2-6 are schematic diagrams of steps of the method for manufacturing the backside-illuminated CMOS image sensor structure according to the method showing in FIG. 1.

Referring to FIG. 2, a conventional process of a backside-illuminated CMOS image sensor is utilized to complete the frontside processing on the front side of the silicon substrate (silicon wafer) 100, which comprises that forming an array of photodiodes (PD) 101 on the front of the silicon substrate (shown in the lower surface), and then perform a back thinning on the back of the silicon substrate. At this point, the thickness of the silicon wafer may be about 3-4 µm remaining.

Step 02: forming grid-shaped deep trenches on the back of the silicon substrate.

Figure 3:
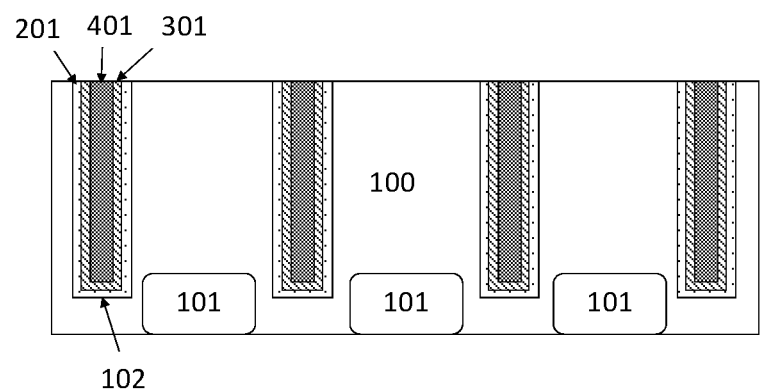

Referring to FIG. 3, the grid-shaped deep trenches 102 (overhead view) may be formed on the back of the silicon substrate by lithography and dry etching processes on the back of the silicon substrate (shown in the upper surface). The formed grid-shaped deep trenches 102 is located between the photodiodes 101 in the photodiode array; and the bottom surface of the deep trenches is up-down staggered with the top surface of the photodiodes 101 in the photodiode array.

The width of the grid of the deep trenches formed as described above may be, for example, 0.25 µm; the depth of the deep trenches may be, for example, 2.5 µm. The depth-to-width ratio after the etch process is at least about 10:1.

Afterwards, the remaining photoresist on the silicon substrate are removed after etching, and the silicon substrate is cleaned.

Step S03: forming an insulating layer on the inner wall surface of the deep trenches to form a grid-shaped deep trenches isolation structure.

With continued reference to FIG. 3, Chemical Vapor Deposition (CVD), Atomic Layer Deposition (ALD) and the like may be used to deposit an insulating oxide layer on the inner wall surface of the deep trenches, typically $SiO_2$, although other insulating materials such as SiN or the like may be used to form the insulating layer 201, to form a grid-shaped deep trenches isolation (DTI) structure.

Step S04: forming a diffusion barrier layer on the surface of the insulating layer.

With continued reference to FIG. 3, the diffusion barrier layer 301 may be formed using CVD, PVD (Physical Vapor Deposition), ALD, sputtering and the like through continuing to deposit diffusion barrier material on the surface of the insulating layer 201, typically Ti, Ta and their nitrides, and some High K (High dielectric constant) materials such as $HfO_2$, $Al_2O_3$, and the like may also be used.

Step 05: filling metal in the deep trenches to form a grid-shaped composite structure in which the metal grid is combined with the deep trenches isolation structure.

With continued reference to FIG. 3, the processes such as CVD, PVD and the like may be adopted to continue the filling of the metal 401 in the deep trenches with the insulating layer and the diffusion barrier layer deposited on the inner wall surface to form the metal grid. The metal material can be W (Wolfram/Tungsten) because W has very high light reflectivity and W has a good ability to fill deep trenches. However, other suitable materials may be used.

After the metal is filled, the surface planarization process may be performed using Chemical Mechanical Polishing (CMP), and then the excess metal W, and the diffusion barrier layer and the insulating layer material on the backside of the silicon substrate are removed, such that the surface height is substantially uniform.

The formed grid-shaped composite structure combined the deep trenches isolation with the Metal grid plays the role of the metal grid and the deep trenches isolation structure, and the method for forming the deep trenches isolation structure and the metal grid adopts an one-step method, so that the process steps can be reduced.

With continued reference to FIG. 1, the method for manufacturing the backside-illuminated CMOS image sensor structure of the present disclosure may further comprise the steps of:

Step S06: etching the back of the silicon substrate to form the cavities in the grid of the deep trenches isolation structure.

Figure 4:
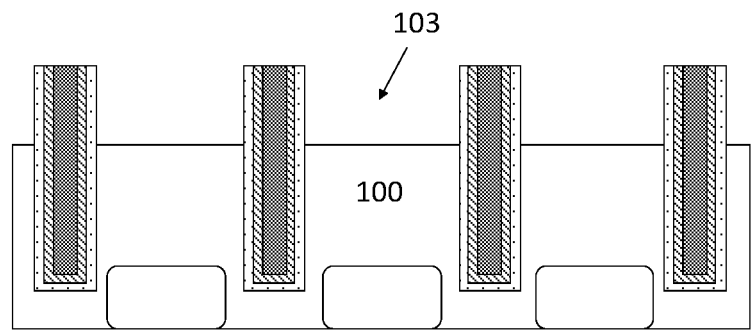

Referring to FIG. 4, then the back of the silicon substrate needs to be etched. The grid-shaped deep trenches isolation structure can be used as a mask, and a wet etching is performed on the back of the silicon substrate to form the cavities 103. The wet etching is adopted for avoiding damage to the silicon substrate by dry etching. The chemical agent used for etching needs to have little or no effect on the metal filling material, the insulating oxide layer material and the diffusion barrier layer material in the deep trenches isolation structure. Common etchants may include TMAH (tetramethyl ammonium hydroxide), although other conditions-compliant etchants may also be used. The etch rate may be controlled slower to control the etch depth. The etch depth may be about 0 5~1 μm. After etching, the distance between the bottom of the cavities (ie, the back of the remaining silicon substrate) and the front surface of the silicon wafer may generally be 2.5-3 μm.

Step 07: coatinging an anti-reflective layer on the back of the silicon substrate.

Figure 5:
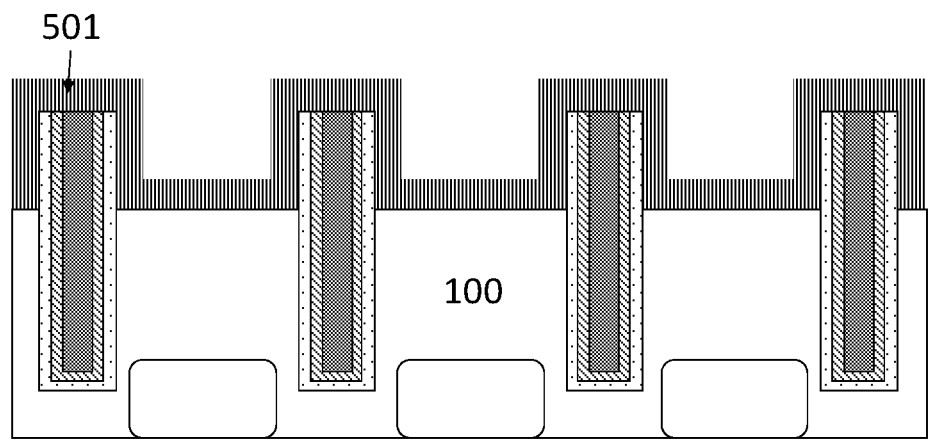

Referring to FIG. 5, the anti-reflective layer (ARC) 501 can be blanket deposited by means of CVD or ALD on the back of the silicon substrate, the anti-reflective layer (ARC) 501 is covering the back of the silicon substrate (i.e., the bottom surface of the cavities) and the top surface of the deep trenchs isolation structure, and the side wall (i.e., the side wall of the cavities) above the exposed back surface of the silicon substrate.

The material of the ARC layer generally comprises $HfO_2$, $Al_2O_3$, $Ta_2O_5$, ZnO, etc. while also being an overlying structure formed of two or more of the materials described above.

Step S08: performing the color filter material filling in the cavities to form a color filter.

Figure 6:
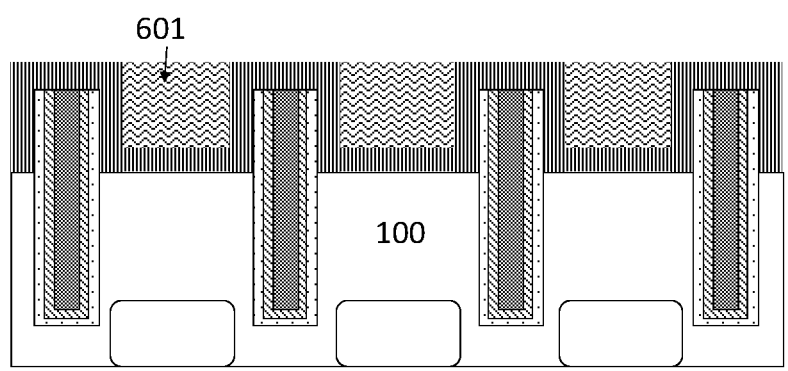

Referring to FIG. 6, the color filter material 601 may be filled in the formed cavities structure by means of a spin coating, the photoresist with dye may generally be used as a color filter material, although other commonly used color filter materials and other commonly used filling methods may also be used to form the color filter (CFA).

Based on the above structure, other structures of the backside-illuminated CMOS image sensor such as microlens can be continued to be made.

In view of the above, the formed deep trenchs isolation structure according to the present disclosure is used as a barrier layer during the backside of the silicon substrate is etched, and the self-aligned etching is formed, so that the lithography step is reduced and the cost is saved. Compared with the method for forming the traditional deep trenchs isolation structure and the metal grid, a one-step method for forming the deep trenchs isolation structure and the metal grid is used according to the present disclosure. The one-step method can reduce the process steps, the grid-shaped composite structure in which the metal grid is combined with the deep trenchs isolation structure plays the role of the Metal grid and the deep trenchs isolation structure at the same time, so that the requirement of high precision alignment of the deep trenchs isolation structure and the metal grid in the traditional process is avoided, the utilization rate of the material is improved, the cost is saved, the process difficulty is reduced, and the production efficiency is improved. Further, the embedded structure of the color filter can also be realized at the same time according to the present disclosure, so that the photosensitive area is closer to the plane of the incident light, and the photosensitive effect of the device is better.

While the present disclosure has been particularly shown and described with references to preferred embodiments thereof, if will be understood by those skilled in the art that various changes in form and details may be made herein without departing from the spirit and scope of the present disclosure as defined by the appended claims.

What is claimed is:

1. A method for manufacturing a backside-illuminated CMOS image sensor structure, comprising:
    Step 01: providing a silicon substrate which has been subjected to a front side processing and a back thinning;
    Step 02: forming grid-shaped deep trenches on the back of the silicon substrate;
    Step 03: forming an insulating layer on an inner wall surface of the deep trenches to form a grid-shaped deep trenches isolation structure;
    Step 04: forming a diffusion barrier layer on a surface of the insulating layer;
    Step 05: filling metal in the deep trenches to form a grid-shaped composite structure in which a Metal grid is combined with the deep trenches isolation structure;
    Step 06: etching the back of the silicon substrate to form cavities in grids of the grid-shaped deep trenches isolation structure.

2. The method of claim 1, wherein in step 01, the front side processing comprises forming a photodiode array on the front side of the silicon substrate; in step 02, the grid-shaped deep trenches formed is located between the photodiodes in the photodiode array.

3. The method of claim 2, wherein a bottom surface of the deep trenches is up-down staggered with a top surface of the photodiode.

4. The method of claim 1, wherein further comprising:
    Step 07: coating an anti-reflection layer on the back of the silicon substrate;
    Step 08: performing a color filter material filling in the cavities to form a color filter.

5. The method of claim 4, wherein in step 06, the back of the silicon substrate is wet etched using the grid-shaped deep trenches isolation structure as a mask.

6. The method of claim 4, wherein in step 07, the anti-reflection layer is blanket deposited on the back of the silicon substrate by CVD or ALD, and the back of the silicon substrate, a surface of the deep trenches isolation structure and a sidewall of the deep trenches isolation structure are all covered by the anti-reflection layer; in step 08, a photoresist with a dye is filled in the cavities as the color filter material by spin coating.

7. The method of claim 1, wherein in step 02, the grid-shaped deep trenches are formed on the back of the silicon substrate by a lithography and an etch processes, and a depth-to-width ratio after the etch process is at least 10:1.

8. The method of claim 7, wherein further comprising removing a photoresist on the silicon substrate and cleaning the silicon substrate after the step 02.

9. The method of claim 1, wherein in step 03, the insulating layer is deposited on the inner wall surface of the deep trenches by CVD or ALD; in step 04, the diffusion barrier layer is formed on the surface of the insulating layer by CVD, PVD, ALD, or sputtering.

10. The method of claim 1, wherein the step 05 comprises, filling the metal in the deep trenches by CVD or PVD, then performing a surface planarization process by CMP, removing the excess metal, the diffusion barrier layer material, and the insulating layer material on the back of the silicon substrate.

* * * * *